United States Patent [19]

Hendrie

[11] 4,218,753
[45] Aug. 19, 1980

[54] MICROCODE-CONTROLLED MEMORY REFRESH APPARATUS FOR A DATA PROCESSING SYSTEM

[75] Inventor: Gardner C. Hendrie, Carlisle, Mass.

[73] Assignee: Data General Corporation, Westboro, Mass.

[21] Appl. No.: 773,023

[22] Filed: Feb. 28, 1977

[51] Int. Cl.² .................... G06F 13/00; G11C 7/00
[52] U.S. Cl. ........................ 364/900; 365/222
[58] Field of Search ... 364/200 MS File, 900 MS File; 340/173 DR; 365/222

[56] References Cited

U.S. PATENT DOCUMENTS

| | | | |
|---|---|---|---|
| B 461,752 | 4/1976 | Delagi et al. | 364/200 |
| 3,729,722 | 4/1973 | Shuba | 340/173 DR X |
| 3,731,287 | 5/1973 | Seely et al. | 340/173 DR X |
| 3,737,879 | 6/1973 | Greene et al. | 340/173 DR X |
| 3,760,379 | 9/1973 | Nibby, Jr. et al. | 365/222 |
| 3,790,961 | 2/1974 | Palfi et al. | 340/173 DR |
| 3,811,117 | 5/1974 | Anderson, Jr. et al. | 340/173 DR |
| 4,006,468 | 2/1977 | Webster | 340/173 DR |
| 4,040,122 | 8/1977 | Bodin | 364/900 |
| 4,084,154 | 4/1978 | Panigrahi | 365/222 |
| 4,106,108 | 8/1978 | Cislaghi et al. | 365/222 |

OTHER PUBLICATIONS

Gerardin et al., "Transparent Refreshing for Semiconductor Dynamic Random-Access Memory" in *IBM Tech. Discl. Bull.*, vol. 16, No. 3, Aug. 1973, pp. 934-936.
Dipilato, "System Control of Memory Refresh", in *IBM Tech. Discl. Bull.*, vol. 18, No. 3, Aug. 1975, pp. 712-713.
Kornstein, "Dynamic Ram Refresh in 8080 Systems," in *New Electronics*, vol. 9, No. 15, p. 15.
Vrba, "Dynamic Memory Research System" in *IBM Tech. Discl. Bull.*, vol. 19, No. 3, Aug. 1976, pp. 758-759.

*Primary Examiner*—Melvin B. Chapnick
*Attorney, Agent, or Firm*—Joel Wall; Jacob Frank

[57] ABSTRACT

A data processing system which employs a CPU and a MOS memory, the memory requiring replenishing or refreshing periodically. The CPU includes microcode containing microinstructions, the microinstructions providing control for the CPU including control for the memory. The refreshing scheme employs apparatus for decoding of these microinstructions and for providing refreshing signals to the memory in such a manner that all non-refreshing operations of the data processing system proceed without being delayed by operation of the refreshing apparatus. The algorithm which guides the operation of the CPU includes a number of system operating modes (such as FETCH, MULTIPLY, DIVIDE, HALT, DATA CHANNEL, and others). These modes each contain an operating state designated RAC→MEM which indicates that a refresh signal automatically is forwarded to the MOS memory when a particular operating mode runs through its respective operating states.

5 Claims, 12 Drawing Figures

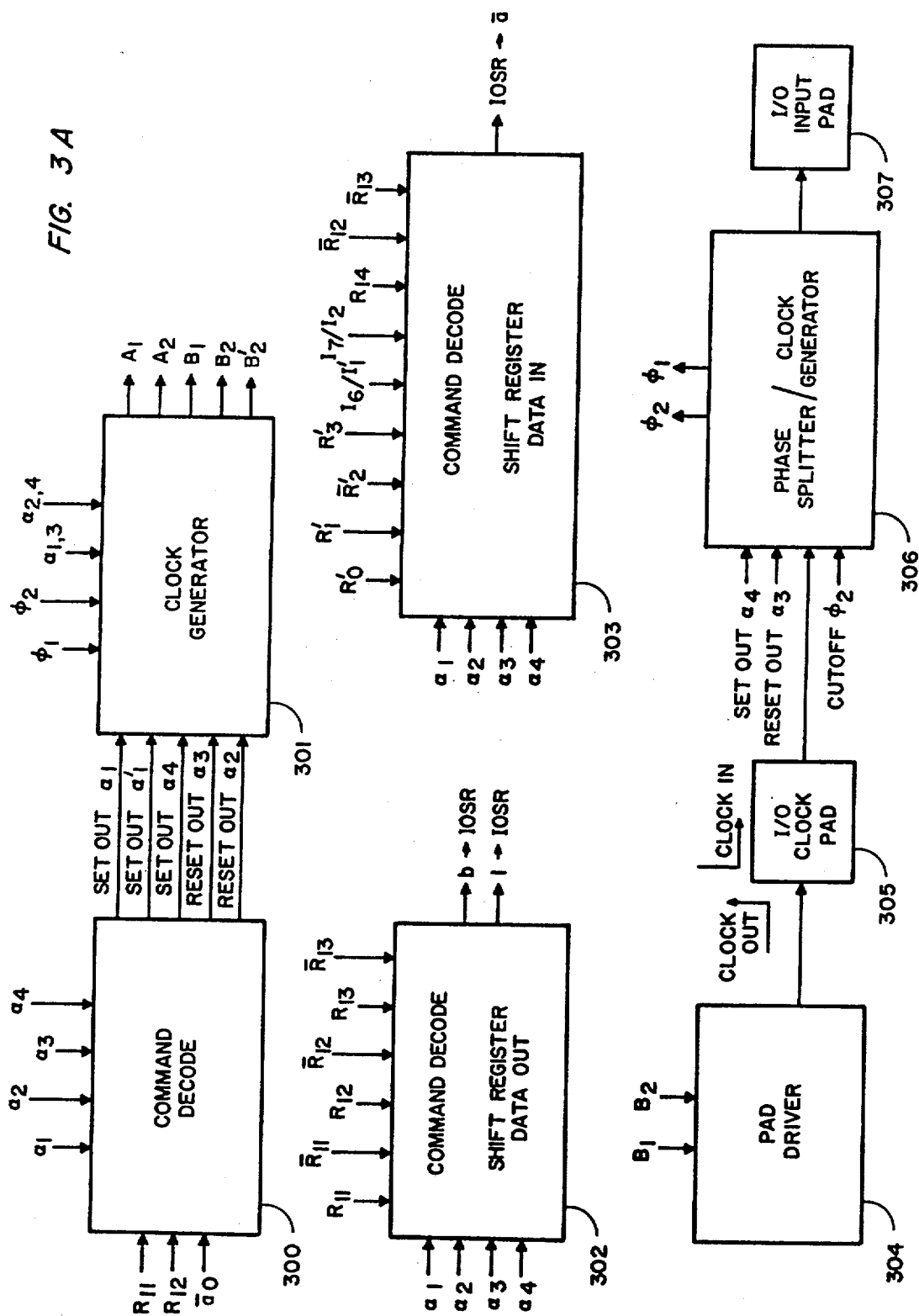

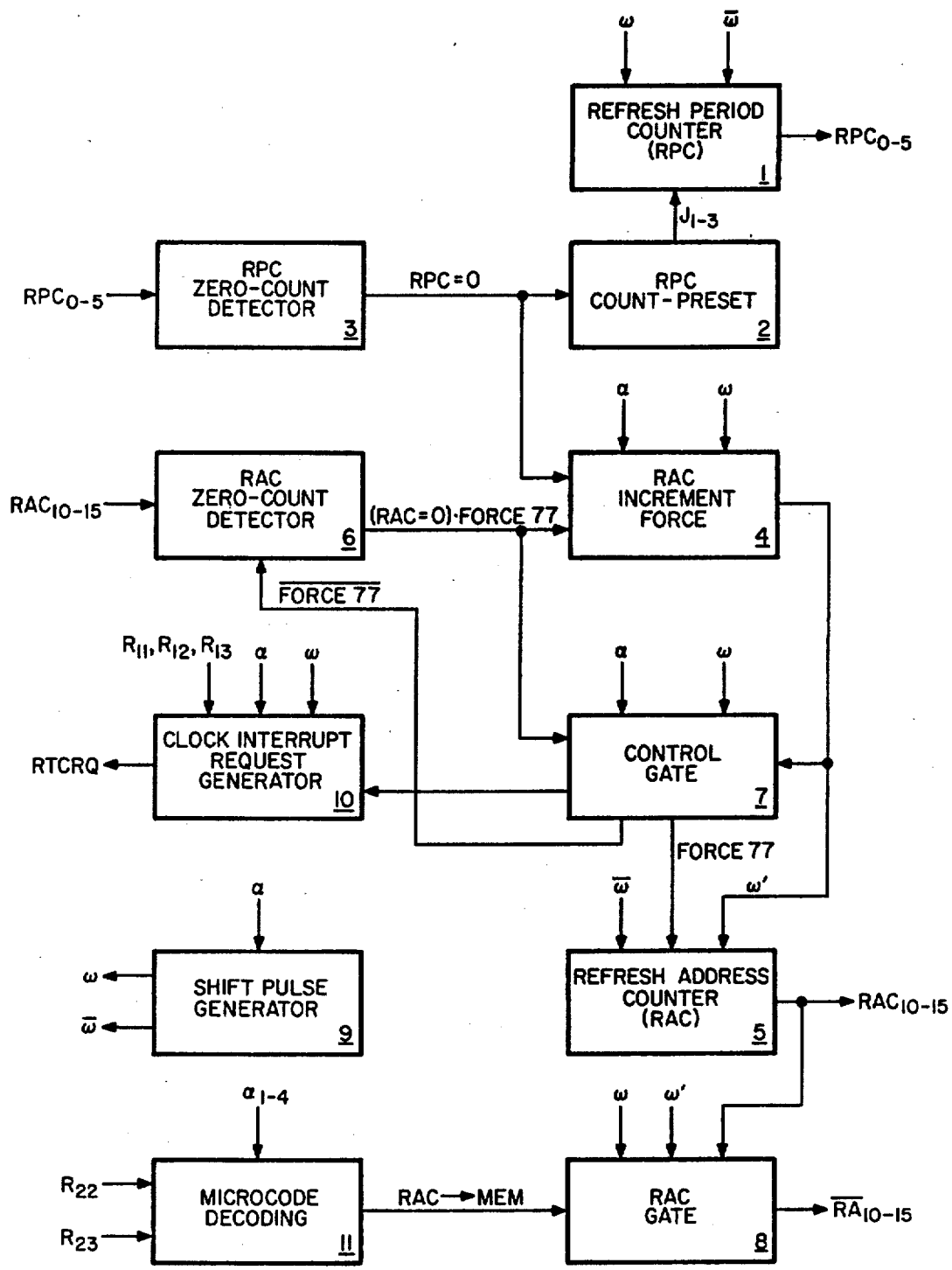
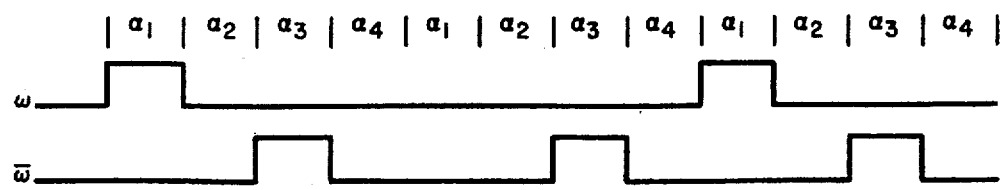

MICROCODE-CONTROLLED MEMORY REFRESH APPARATUS FOR A DATA PROCESSING SYSTEM

BACKGROUND OF THE INVENTION

1. Field of the Invention

The present invention relates to an improved data processing system employing digital techniques and more particularly to an improved memory refreshing system included therein.

2. Description of Prior Art

In the prior art, various problems existed with regard to parallel transmission of digital information (all data bits transferring simultaneously) between the data processor's CPU and various peripheral devices. These problems related to the relatively large number of wires required in the connecting bus for the parallel transmission scheme. These many parallel paths, in turn, required a like number of drivers and receivers for each peripheral device TELETYPE printer, CRT display, etc.) connected thereto. The complexity of this input-/output system reduced the reliability and increased the cost of the overall data processor system.

Parallel transmission, and the resulting large number of connecting wires, was employed in the prior art because the CPU was required to perform many functions, such as instruction decoding. Decoding results in parallel data paths. In order to reduce this large number of wires with their inherent problems, a prior art solution transferred many functions performed by the CPU to the jurisdiction of peripheral device controllers. Accordingly, a parallel to serial data conversion was made in the CPU, a serial transmission of data employed, and a serial to parallel reconversion of data made in the controllers. Since serial transmission of data (one-by-one) is usually slower than parallel transmission (all data bits transferring at once), a higher clock frequency is needed with serial data transmission to provide reasonable or comparable system speed.

However, this serial-parallel conversion plus high clock rate solution created other prior art problems, which obtained from inherent limitations of bipolar, MOS, and other technology utilized. For example, a well-shaped pulse (clock, data, or command) can become a distorted signal at the end of a transmission line or bus cable, depending upon length of the line, quality of the line, frequency of transmission, external noise, and other factors. Use of a higher transmission frequency for serial transmission of data to maintain good system speed facilitates the deterioration of pulses transmitted. The sampling of this kind of distorted signal to re-create a workable pulse is a further problem of the prior art, even when employing state-of-the-art MOS technology. Furthermore, skewing (or phase-shifting) of data caused by inherent limitations of bipolar technology when operating upon a serial data stream is a prior art concern.

As noted, in the prior art, delegation of more control functions from the CPU to other subsystems have been made. There have been developed peripheral device controller (IOC) subsystems which have their own control store for carrying out their required control functions. Similarly, peripheral processors are now being designed with their own control store units. While each control apparatus provides means for controlling the manipulation of its own processor, it also may possibly provide means for controlling manipulations which occur within other processors. But, this combination of multiple control apparatus and processing units presents synchronization of operations and pulse propagation delay problems; accordingly, the number and displacement along the bus of the peripheral devices of the prior art may have to be restricted for reasons earlier indicated. Examples of patents related to this discussion of input/output digital pulse transmission include U.S. Pat. Nos. 3,931,615; 3,932,841; and 3,934,232.

With regard to MOS memories, static MOS RAMs or ROMs are slower and larger than dynamic memories. Therefore, dynamic memories are more desirable from this point of view; but, dynamic memories suffer from the drawback of inherently losing or dissipating the information stored in the memory. In MOS devices, the storage mechanism is a voltage stored on the inherent capacitance of the MOS device. Capacitance inherently leaks charge, and the memory must therefore be replenished or refreshed within sufficiently short intervals to insure that none of the binary information (data words, instruction words, (etc.) is lost by way of this drawback.

One of the principal problems relating to refreshing of dynamic memories involves delay in the overall system operation because memory must be refreshed within a relatively short period of time. The present invention provides a solution to this problem by integrating the microinstructions which control the refreshing operation into the overall algorithm or flow chart of operating states for the CPU in a sufficient number of strategic places to insure that a memory refresh command will be generated within each and every critical refreshing time interval.

SUMMARY OF THE INVENTION

The present invention relates to a data processing system in which the CPU has microcode control containing microinstruction. A main memory interfaces with the CPU for storing data and instructions. The CPU comprises apparatus for refreshing or maintaining the binary data in the memory by repetitively replenishing the physical quantity representative of the binary data, and performs this refreshing within sufficiently short successive time intervals to prevent loss of any of the binary information. There is also provided circuit apparatus responsive to operation of the microcode control for integrating the refreshing operation within the overall operation of the data processing system in such a manner that all non-refreshing operations of the data processing system proceed without being delayed by operation of the refreshing apparatus.

In a further feature of the present invention wherein the memory is constructed from MOS technology and comprises a plurality of memory locations, and wherein the physical quantity representation of the binary data is voltage stored on inherent capacitance in the MOS memory, the refreshing apparatus comprises first and second counter circuits.

In yet a further feature of the present invention the apparatus for integrating the refreshing operation includes circuitry for decoding the microinstructions from the microcode control and gate circuitry responsive to operation of both counter circuitry and decoding circuitry for permitting generation of refreshing signals to the memory.

In a still further feature of the present invention polynomial counters are employed as the counter circuits.

It is advantageous for one to incorporate the present invention within a data processing system that employs a MOS memory, such as an MOS RAM (Random Access Memory) because the system operation is not slowed down since the system operation does not have to stop while the memory is being refreshed; the memory is being refreshed at the same time that the system operation is taking place.

It is thus an object of the present invention to provide an improved data processing system.

It is another object of the present invention to provide an improved memory refreshing scheme for use with dynamic memories.

Other objects and advantages of the present invention will be understood by those of ordinary skill in the art, after referring to the detailed description of the preferred embodiments and the appended drawings wherein:

BRIEF DESCRIPTION OF THE DRAWINGS

FIGS. 3A and 3b are detailed diagrams of the remaining part of the electronic structure within each IOSR, and waveforms related to the operation of each IOSR;

FIG. 9 is a diagram of an illustrative embodiment of the present invention, and waveforms associated therewith.

INTRODUCTION

In one particular data processing system in which the present invention is employed, the chip set is constructed from silicon-gate NMOS technology. The CPU features a 16-bit, multi-function instruction set, including hardware multiply/divide; multiple addressing modes including absolute, relative indexed, deferred, and auto increment/decrement; multiple accumulators, including two that can be used as index registers; hardware stack and frame pointers with stack overflow protection; programmed priority interrupt to 16 levels; and separate memory and input/output busses. A Real-Time Clock and Random Access Memory refresh control (needed because of the MOS technology) are an integral part of the CPU. The CPU also features an input/output or interface structure with a unique encoding/decoding scheme that, in conjunction with the transceivers and IOC chips, provide the functional equivalent of a 47-line bus.

The IOC (input output controller) decodes a 16.6 megabit/second encoded data stream from the CPU and presents a 16-bit bi-directional interface, four encoded function bits, and a function strobe, for simple interfacing. The IOC further incorporates complex functions not employed in other mini-computer systems. The IOC includes integral device identification, busy/done interrupt logic, and a per-device interrupt masking capability. For block-oriented controllers, it includes data channel (DMA) bus hand shaking, and full 15-bit address and block length registers. Power-up initialization logic, orderly power shut down circuitry, and user-selectable data bus signal polarity are also provided.

The CPU transceiver and the device transceiver buffer the I/O bus. They provide differential drive and receive circuits for noise immunity and up to 100-foot length. They also clock bus signals in transmit mode and reclock them in receive mode using a high noise immunity detection scheme.

DESCRIPTION OF THE PREFERRED EMBODIMENT

Figure 1:
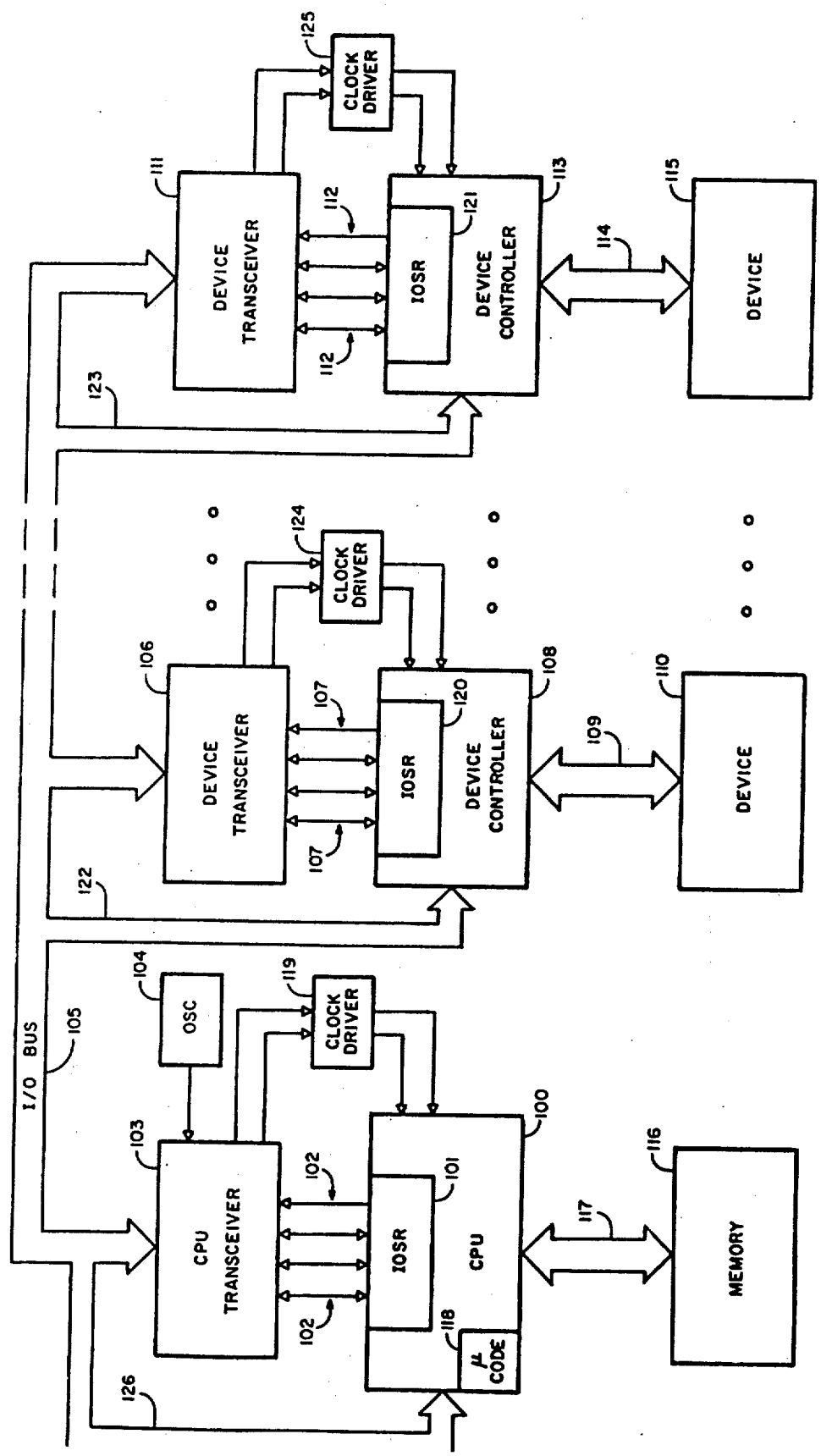
FIG. 1 is a diagram of a data processing system in which the present invention is employed.

Referring to FIG. 1, there is disclosed a functional block diagram of the system in which the present invention is included. Central processing unit (CPU) 100 includes microcode (u code) 118, input/output shift register (IOSR) or interface means 101, and other CPU structure (not shown). CPU 100 is connected to CPU transceiver 103 by way of a first group of conductors 102. CPU transceiver 103 receives an input from 10 MHZ crystal clock oscillator 104 as shown and provides a representation of that clock to clock driver 119, which, in turn, provides clock signals to CPU 100 and derivations of those clock signals to IOSR 101.

CPU transceiver 103 is connected by way of I/O BUS (input/output BUS) 105 to device transceiver 106 and device transceiver 111. The dashed line construction of I/O BUS 105 in combination with the dots shown between transceivers etc. are intended to indicate that the BUS can be sufficiently long to accomodate more transceivers than that which is shown in FIG. 1. The present invention is not intended to relate to only two device transceivers and controllers. Other BUS components (bypass BUS) are designated 122, 123, and 126; these components are intended to bypass transceiver 106, transceiver 111 and transceiver 103 respectively.

Device transceiver 106 is connected to device controller 108 by way of a second group of conductors 107, which conductors interface with IOSR 120 (interface means 120) contained within device controller 108. Further, there is a clock pulse connection between device transceiver 106 and device controller 108 by way of clock driver 124. As noted, bypass BUS 122 connects device controller 108 directly to I/O BUS 105.

With regard to device transceiver 111, (and this general connection scheme applies to any other transceivers that may be connected to BUS 105 by implication of the dots in FIG. 1), it is connected to device controller 113 by another second group of conductors 112. The conductors interface with IOSR 121 (interface means 121) contained within device controller 113. Further, there is a clock pulse connection through clock driver 125, between device transceiver 111 and device controller 113.

Device controller 108 is connected to its respective peripheral device 110 through a peripheral device BUS 109. Device controller 113 is connected to its respective peripheral device 115 through peripheral device BUS 114.

Finally, main memory 116 is shown connected to CPU 100 by way of memory BUS 117.

Figure 2:
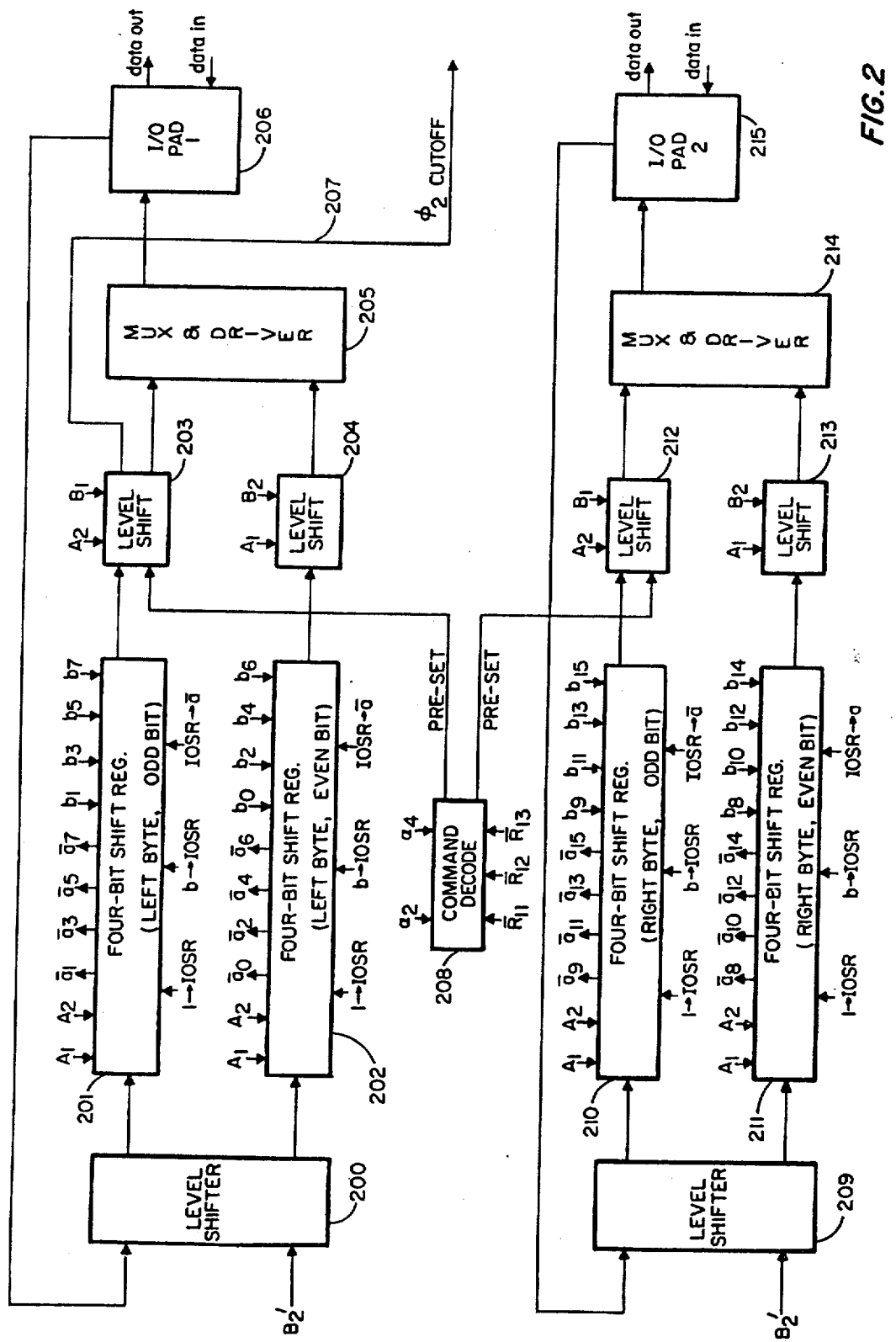
FIG. 2 is a detailed diagram of part of the electronic structure within each IOSR input/output shift register of FIG. 1.

Next, with reference to FIG. 2 and FIG. 3A, there is shown the circuitry that is contained within IOSR 101, IOSR 120, or IOSR 121 all shown with FIG. 1. (Structure in FIG. 1 is referenced by numerals in the 100's, FIG. 2 in the 200's, etc.) There are shown four input/output pads: I/O pad 206, I/O pad 215, I/O clock pad 305, and I/O input pad 307. These four pads correspond respectively to the four conductors of each group of conductors 102, 107, or 112. The unidirectional conductor shown corresponds to pad 307. As will be described further hereinbelow, data is serially received by and transmitted to pads 206 and 215, the clock or clock burst is generated from and received at clock pad 305, and pad 307 provides a control signal to its respective transceiver when a respective interface means is transmitting.

FIG. 2 shows a first shift register means in the upper portion and a second shift register means in the lower portion of the drawing. I/O pad 206 is connected between the input to level shifter 200 (a TTL or bipolar to MOS interface) and the output from multiplexer and driver 205, as well as being connected to a transceiver as noted above. Level shifter 200 receives another signal $B_2'$ from clock generator 301, discussed hereinbelow.

There are two outputs from level shifter 200. One of the outputs goes to four-bit, left byte, odd bit shift register 201 and the other goes to four bit, left byte, even bit shift register 202. Shift registers 201 and 202 also receive $A_1$ and $A_2$ shift command signals, also from clock generator 301. Parallel connections $\bar{a}_1$, $\bar{a}_3$, $\bar{a}_5$, and $\bar{a}_7$ are intended to indicate odd-bit connections between shift register 201 and the "a" BUS contained within the host component, (e.g. host component CPU 100, the "a" bus not shown therein for purposes of clarity of illustration). Likewise, $\bar{a}_0$, $\bar{a}_2$, $\bar{a}_4$, and $\bar{a}_6$ are intended to designate even bit parallel data connections between shift register 202 and the "a" BUS. Similarly $b_1$, $b_3$, $b_5$, $b_7$ and $b_0$, $b_2$, $b_4$, $b_6$ are parallel connections between shift register 201 and the "b" BUS and shift register 202 and "b" BUS respectively.

There are three more command signal inputs to shift register 201 and shift register 202 and they are 1→I, OSR, b→IOSR, IOSR→ā. Respectively these designate placement all "1's" on the shift register, transfer of the contents of the b BUS to the shift register, and transfer of the contents of the shift registers to the ā BUS. (This is a parallel transfer of the data into and out of the shift register from other circuitry in the CPU).

The output of shift register 201 is connected to level shift 203 which also receives $A_2$ and $B_1$ from clock generator 301. The output of shift register 202 is connected to level shift 204 which also receives input signals $A_1$ and $B_2$ from clock generator 301. Level shift 203 also receives a PRESET signal from command decode 208. In turn, command decode 208 receives signals $\alpha 2$, $\alpha 4$, further derived clock pulses from CPU 100, and command signals $\bar{R}_{11}$, $\bar{R}_{12}$, $\bar{R}_{13}$ from microcode 118 of CPU 100.

Output of level shift 203 is connected to the input of multiplexer and driver 205; output of level shift 204 is connected to the input of multiplexer and driver 205. The output of multiplexer and driver 205 is connected to I/O data pad 206, as noted earlier. Finally, another output of level shift 203, $\phi_2$CUTOFF is provided on conductor 207 as a signal which is conducted to structure 306 (in FIG. 3A) to be discussed below.

A detailed interconnection description of the second shift register means contained in the lower half of FIG. 2, comprising shift registers 210 and 211, level shifter 209, and level shifts 212 and 213, is not necessary since the structure is almost precisely identical to the first shift register means in the upper portion of the diagram and described above. It should be noted that the $\phi_2$ CUTOFF signal is not present, however, and a different 8 bit byte (right byte) is processed.

As noted earlier, FIG. 3A is also contained within IOSR 101, or 120, or 121. Command decode 300 is operational in connection with clock generator 301, and both blocks will be discussed together. Command decode 300 receives derived clock signals $\alpha 1$, $\alpha 2$, $\alpha 3$, and $\alpha 4$ from other portions of the host component or block, such as, from other portions of CPU 100, or device controller 108, or device controller 113, as the case may be. (This will be further discussed later, in connection with FIG. 4, since there is circuitry contained in FIG. 4, and shown in FIG. 1 as clock drivers 119, 124, or 125 which provide clock pulses to either CPU 100, or controllers 108 or 113 respectively. These clock pulses are pulses which are further derived into clock pulses $\alpha 1$, $\alpha 2$, $\alpha 3$, $\alpha 4$. Suffice it to say at this point that the $\alpha$ pulses are clock pulses which do not overlap).

Command decode 300 receives inputs $R_{11}$ and $R_{12}$ from microcode 118 in CPU 100 (or from like circuitry in controller 108 or 113 as the case may be). There are five pulse signals derived from command decode 300 which are designated as set out $\alpha 1$, set out $\alpha 1'1$, set $\alpha 4$, reset out $\alpha 3$, and reset out $\alpha 2$. The nomenclature designation of these signals as such is of no particular moment, since the signals connect directly into clock generator 301.

Clock generator 301 further receives $\alpha 1$, clock pulses, $\alpha 2,4$ clock pulses which are timed with clock pulses earlier described except $\alpha 1$ and $\alpha 3$ appear on one line, and $\alpha 2$ and $\alpha 4$ appear on another conductor or line. $\phi 1$ and $\phi 2$ are further signal inputs to clock generator 301 and are derived from phase splitter/clock generator 306. These clock pulses do not exist when the interface means being described is in "output mode" (to be further described below), and do exist when the interface means is in "input mode" (again to be further described below).

Suffice it to say at this point that $\phi 1$ and $\phi 2$ are clock pulses derived from circuitry in structure 306 responsive to an input clock received on clock pad 305 and provide timing information for clock generator 301 from which the latter derives clock pulses A1, A2, B1, B2, and $B_2'$.

Figure 3B:
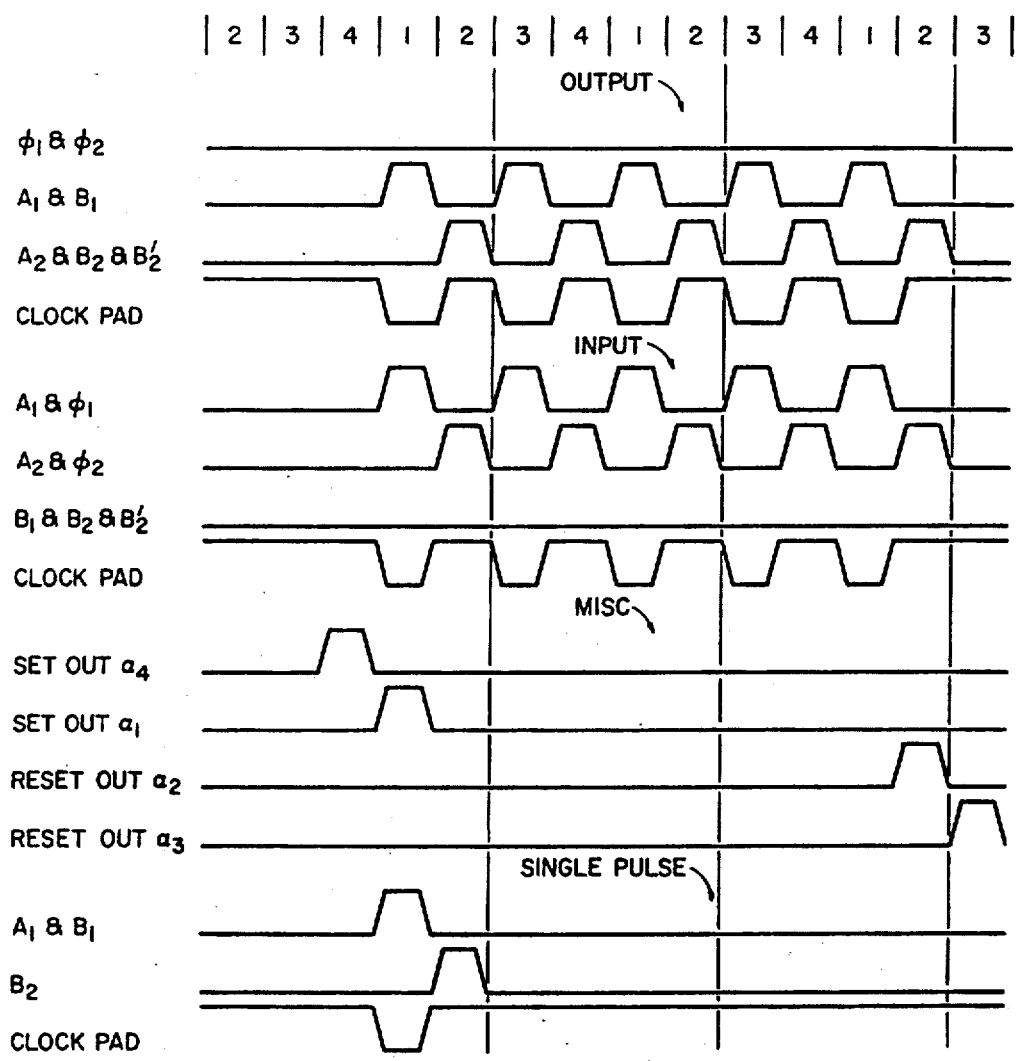

By reference to the waveform diagram of FIG. 3b, it is seen that in output mode, A1 and B1 have the same waveform; A2, B2 and $B_2'$ have the same waveform and are out of phase with A1. Also, it can be seen that in output mode, $\phi 1$ and $\phi 2$ pulses are zero.

By contrast, in input mode A1 and $\phi 1$ are pulses of the same type and timing and are out of phase with pulses A2 and $\phi 2$ which are likewise of the same type and timing. It is further noted that B1, B2 and $B_2'$ are zero in input mode. All of these pulses, their representations, and reasons therefor will be discussed in detail in the operation description portion of this specification hereinbelow.

Referring to command decode shift register data out block 302, it likewise receives alpha clock pulses $\alpha 1$, $\alpha 2$, α3, α4, and microcode instructions $R_{11}$, $R_{12}$, $R_{13}$, $R_{11}$, $R_{12}$ and $R_{13}$. The alpha clock pulses are obtained as earlier noted and the R pulses are obtained from microcode 118 or similar circuitry in respective device controllers as shown in FIG. 1 Output from decode block 302 is two command signals: "b→IOSR" which means that the contents of data on the "b" BUS will be placed in IOSR 101, 120, or 121 as the case may be; and the other signal, "1→IOSR" means that shift register means will be loaded with all "1's" for purposes later to be explained. These two signals are conducted to shift registers 201, 202, 210, and 211.

Similarly, command decode 303 is responsive to alpha clock signals and "R" signals obtained from respective microcodes, and to "I" signals from the CPU's (or controller's) instruction register, to provide an output signal, "IOSR→a". This output signal is conducted to shift registers 201, 202, 210 and 211, of respective IOSR's and means that data contents of the shift register means is being parallel transferred to the a BUS within the host circuitry (either CPU 100, controller 108, or controller 113 as the case may be.)

Referring next to pad driver 304, I/O clock pad 305, phase splitter 306 and I/O pad 307, driver 304 includes circuitry for providing proper drive of the clock pulse burst to clock pad 305, when the IOSR is in output mode. As noted B1 and B2 are derived from clock generator 301 and these clock pulses are indicated in the waveform diagram, FIG. 3b. In output mode I/O clock pad 305 provides this clock pulse burst to its respective transceiver.

Phase splitter 306 receives an input clock from its transceiver via pad 305 when the IOSR is in input mode (but ignores signals on pad 305 in output mode). Phase splitter 306 also receives signals "set out α4" and "reset out α3" from structure 300 as well as φ2 CUTOFF from structure 203, and provides internal clock signals φ1 and φ2. (In input mode, φ1 and φ2 are generated responsive to various conditions including "set out α4" being asserted, and "reset out α3" not being asserted; the opposite is true in output mode, φ1 and φ2 not being generated in output mode, as will be explained in the operation description below.) Phase splitter 306 also is connected to input pad 307.

Finally, with regard to circuitry within all structures depicted in FIGS. 2 and 3A, they are fabricated from standard logic interconnections, utilizing MOS technology. Those of ordinary skill in this art can design logic of this kind from known techniques. Therefore, and in the interest of clarity of presentation, such detail is not shown.

Figure 4:
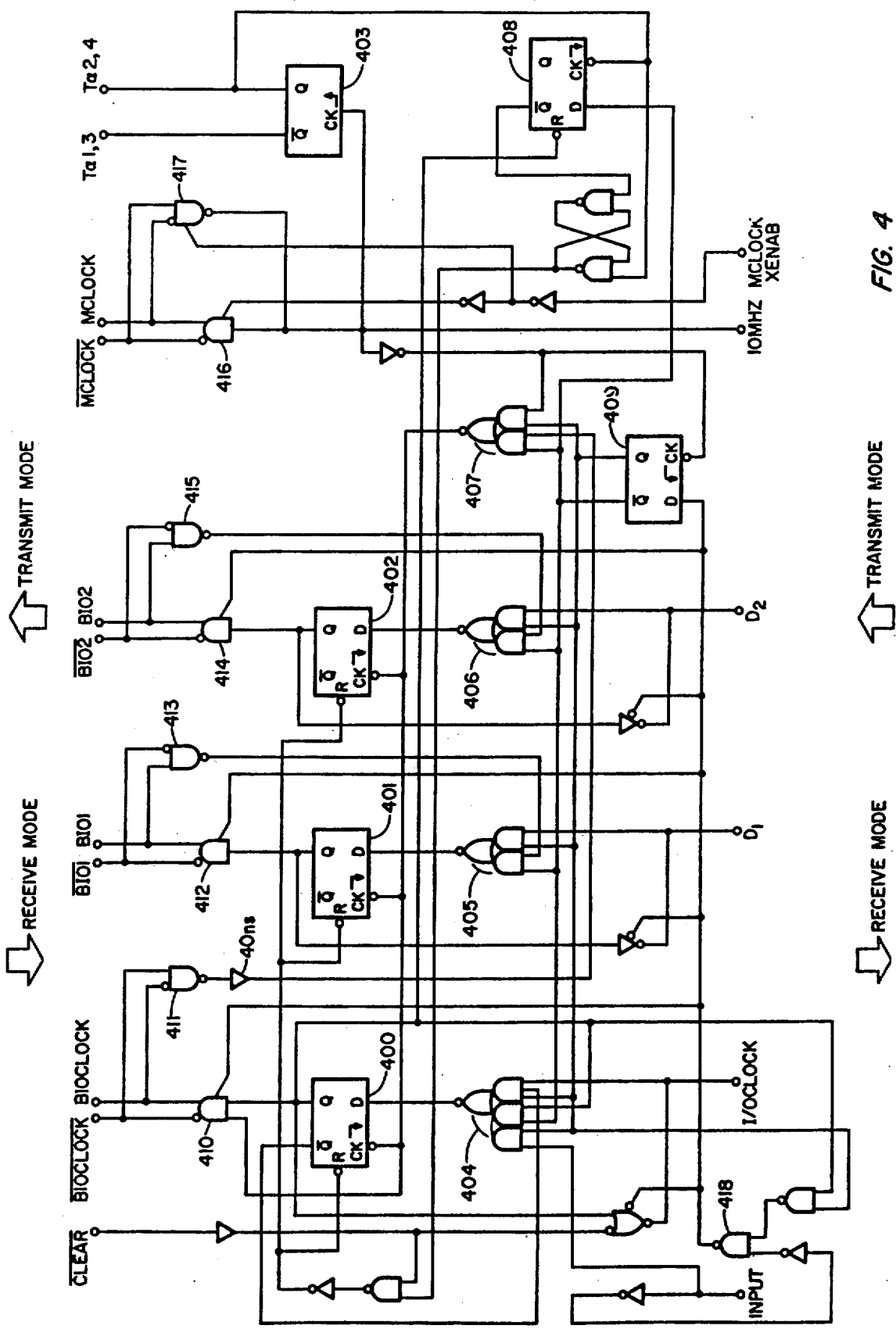
FIG. 4 is an electrical schematic diagram of the circuitry within each transceiver of FIG. 1.

Prior to discussion of the inter-connections of FIG. 4, consider I/O BUS 105. I/O BUS 105 and bypass busses 122, 123, and 126 each contain a multiplicity of conductors. In the preferred embodiment of the present invention the BUS contains sixteen separate conductors or conducting paths for conduction of electrical signals or pulses to and from various components. The paths can be identified as follows: MCLOCK and $\overline{\text{MCLOCK}}$, which designate two differential local clock signal paths; BIO1 and $\overline{\text{BIO1}}$ which designate a first two differential data paths; BIO2 and $\overline{\text{BIO2}}$ which designate a second two differential data paths; BIO CLOCK and $\overline{\text{BIO CLOCK}}$ (BUS input output clock) which designate another two differential clock signal paths; $\overline{\text{BEXTINT}}$, BUS external interrupt; $\overline{\text{BDCINT}}$, BUS data channel interrupt; INTP, interrupt priority; DCHP, data channel priority; $\overline{\text{CLEAR}}$, a clear pulse; and three separate ground conductors. At least $\overline{\text{BEXTINT}}$ and $\overline{\text{BDCINT}}$ are signals which are conducted in bypass busses. The operation dependent upon and responsible for these various clock signals and data path signals will be discussed later in the operation description, the copper wire designations presented at this point for ease of description of FIG. 4, the transceiver.

The circuitry of FIG. 4 is contained within either CPU transceiver 103, device transceiver 106, or device transceiver 111. The circuitry in each of these transceiver blocks is substantially the same. The four conductors connecting a respective IOSR to a respective transceiver are shown at the bottom of FIG. 4 as I/O CLOCK terminal, D1 terminal, D2 terminal, and INPUT terminal. The INPUT terminal corresponds to the unidirectional conductor of the four conductors shown in each group in FIG. 1. The other terminals at the upper portion of FIG. 4 such as $\overline{\text{CLEAR}}$; $\overline{\text{BIO CLOCK}}$; BIOCLOCK, $\overline{\text{BIO1}}$, BIO1; $\overline{\text{BIO2}}$, BIO2; $\overline{\text{MCLOCK}}$, MCLOCK are all contained within I/O BUS 105 as noted earlier. $T_{α1,3}$ and $T_{α2,4}$ designate terminals from which high or driver clock signals are provided, and are shown in FIG. 1 as those lines connecting from a respective clock driver; (for example the lines connecting CPU 103 and clock driver 119). In FIG. 4, the terminal designated 10 MHZ is that terminal to which clock oscillator 104 of FIG. 1 is connected. The terminal designated MCLOCK XENAB is not a terminal to other devices, but is internally connected within a respective transceiver chip to either a high or low voltage depending upon its usage as either a CPU transceiver or a device controller transceiver.

In FIG. 4, differential transmitters 410, 412, 414, 416 are shown as are differential receivers 411, 413, 415, and 417. Differential pair 410, 411 is interconnected with flip flop 400 and AND/OR gate 404; differential pair 412, 413, is interconnected with flip flip 401 and AND/OR gate 405; differential pair 414, 415 is interconnected with flip flop 402 and AND/OR gate 406; and differential pair 416, 417 is interconnected with flip flop 403 and AND/OR gate 407. An output of flip flop 409 is connected to an input of AND/OR gates 404-407; inputs to flip flop 409 are received from output of NAND gate 418 as well as from output of differential receiver 417. Other AND, NAND, inverter and other logic circuits shown in the diagram are interconnected in a straightforward manner as shown. Flip-flop 408 is interconnected with the output from flip-flop 403 and the output from flip-flop 409; more specifically, the Q output of flip-flop 403 is connected to the clock input of flip-flop 408; and the $\overline{\text{Q}}$ output of flip-flop 409 is connected to the D input of flip-flop 408; the Q output of flip-flop 400 is connected to the reset R input of flip-flop 408; the output of flip-flop 408 is connected by way of gates to the R (reset) inputs of flip-flops 400, 401, and 402.

Figure 5:
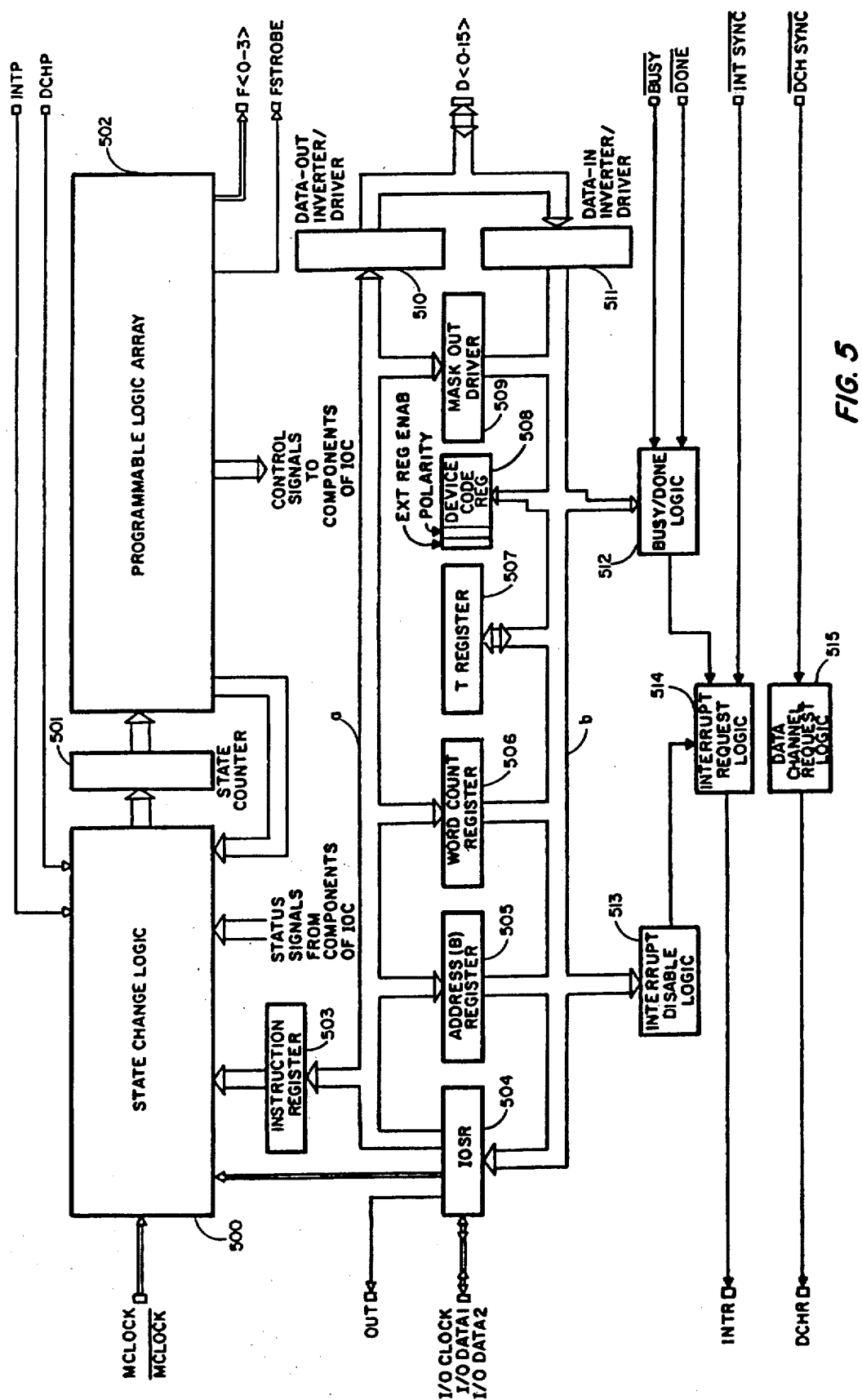
FIG. 5 is a detailed diagram of the electronic structure within each device controller of FIG. 1.

Next, referring to interconnections of FIG. 5, there is disclosed a block diagram of device controller 108 or 113 of FIG. 1. IOSR 504 is equivalent to IOSR 120 or 121, and thus to that which is shown in FIGS. 2 and 3a. Serial inputs to IOSR 504 are shown as I/O CLOCK, I/O DATA 1, and I/O DATA 2 which are equivalent to the I/O CLOCK D1, and D2 respectively in FIG. 4. Terminal "OUT" in FIG. 5, connected IOSR 504, is equivalent to terminal "INPUT" in FIG. 4.

IOSR 504 is parallel connected by way of the "a" BUS to the input of instruction register 503, address register 505, word count register 506, mask-out wired driver 509, and data out inverter driver 510. The output from data out inverter driver 510 is parallel connected by way of an output terminal to the respective peripheral device, as for example, device 110 of FIG. 1 in connection with device controller 108.

There is a return BUS, designated "b" BUS returning from the peripheral device by way of data-in inverter and driver 511. The "b" BUS parallel interconnects outputs of driver 509, device code request 508, T register 507 (and its input), word count register 506, and address register 505, to the inputs of IOSR 504 and interrupt disable logic 513.

In the upper left portion of the diagram of FIG. 5, instruction register 503 provides an input to state change logic 500. Other inputs to state change logic 500 include MCLOCK, $\overline{MCLOCK}$ input. This clock input is received by way of terminals $T\alpha_{1,3}$ and $T\alpha_{2,4}$ of FIG. 4. Output from state change logic 500 feeds state counter 501, in turn feeding programmable logic array (PLA) 502. PLA 502 is a read only memory and provides control signals to components of the device controller (IOC) as shown in FIG. 5. The interconnection of the control signals are not shown for purposes of clarity of illustration. (Likewise, there is an interconnection between device code request 508 and state change logic 500 which is not shown in the diagram for purposes of clarity of illustration.)

Terminals designated INTP, DCHP, F(0-3), F STROBE, D(0-15), BUSY, DONE, INTSYNC, DCH SYNC are all connected to the respective device controller for purposes to be explained hereinbelow. BUSY/DONE logic 512 provides an input to interrupt request logic 514, which also receives an input from interrupt disable logic 513. The output from interrupt request logic 514 feeds terminal designated INTR which is conducted by way of bypass bus (for example bus 122 in FIG. 1) to CPU 100. Finally, data channel request logic 515 which receives an input directly from the peripheral device via terminal DCH SYNC provides an output on terminal DCHR, again by way of a bypass BUS, directly to the CPU.

The foregoing concludes the interconnection of components relative to the preferred embodiment of the present invention.

Figure 6A:
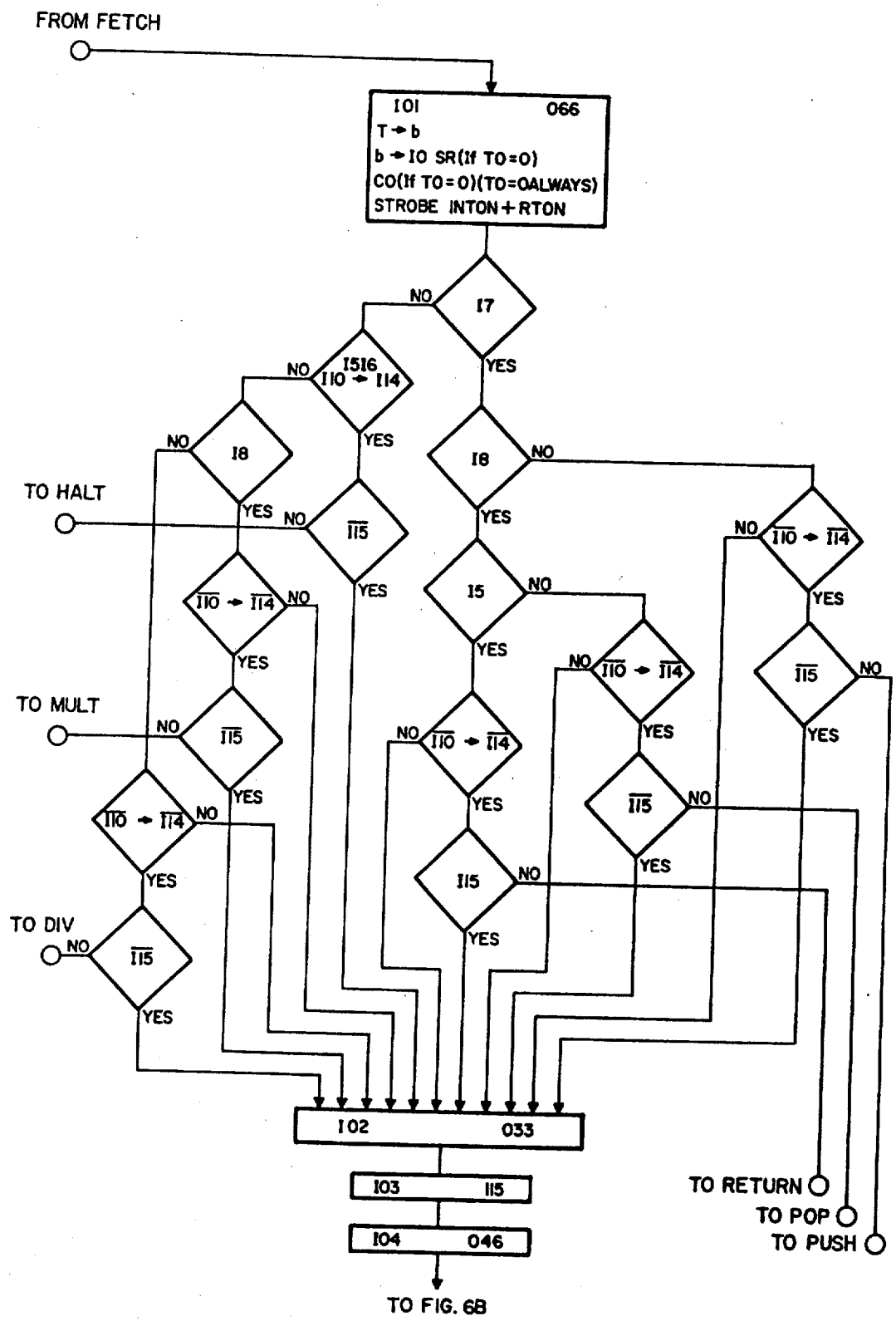
FIGS. 6a and 6b taken together are a flowchart of the input/output cycle or sequence of events of the system of FIG. 1.
Figure 6B:
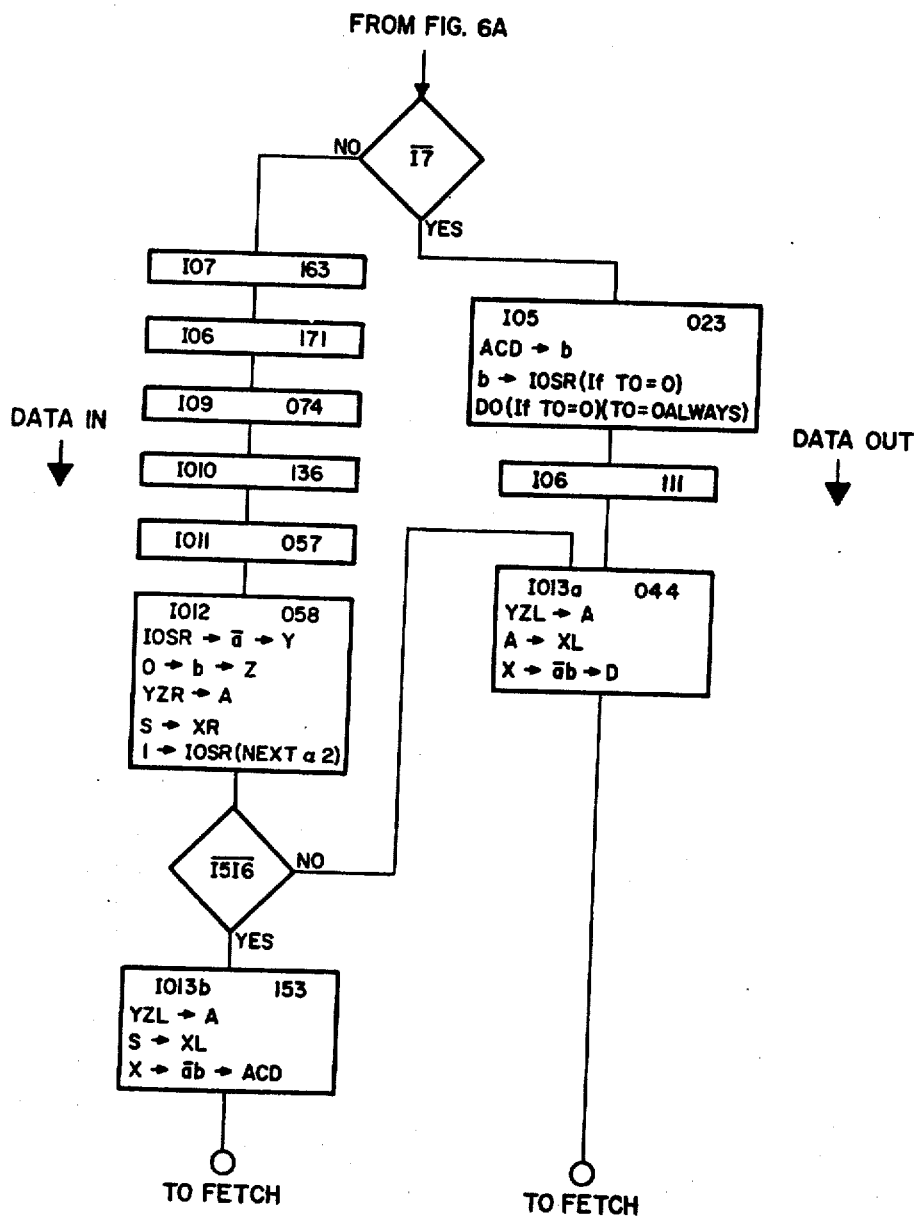

With regard to FIGS. 6a and 6b, the algorithm that presents the step-by-step procedure for the input/output (CPU) sequence, is depicted in a flow chart. Other cycles or sequences for the computer such as FETCH, or HALT, are not shown. An instruction is obtained from FETCH to start the I/O algorithm. The various states of the system are represented by rectangular boxes, and decisions made by logic within the system are represented by diagonal boxes. It is seen that after state 066 has been completed wherein the contents of the CPU's "T register" are placed on its "b BUS", and contents of b BUS are conducted to the CPU's IOSR under certain conditions, and other functions have been performed, there are a multiplicity of decision boxes from which the I/O algorithm execution may be foreshortened. (The decision boxes relate to specific bits in the CPU's instruction register, (IR), for example 17 relates to the IR's seventh bit, etc.) If state 033 is not reached, the logic has determined that the system should go to HALT, MULT (multiply), DIV (divide), or to PUSH or POP (to memory), or even to RETURN. If any of these commands are enabled the input/output algorithm is not completed. However, should state logic 046 be completed, then a decision is made whereby either a DATA IN or DATA OUT flow is continued. DATA IN flow path precedes with state 163 and terminates with state 153 as shown, after which a command is sent to FETCH wherein a new instruction is fetched; otherwise, the flow chart precedes down the right hand portion wherein state 023, 111, and 044 are reached whereafter a command signal to FETCH is generated and a new instruction is fetched.

The state numbers 066, 033, 046, etc. are certain designations from amongst a large field of designations denoting every state in the overall flowchart for the CPU. The state numbers IO1, IO2, IO4, etc. are designations relative only to this particular input/output sequence.

In states 066, 058, 153, 023, and 044 various transfers of digital information under certain conditions are schematically represented. The details of each transfer need not be explicitly stated, since the structures transferring and receiving the information are contained within a portion of CPU 100, that is not part of the present invention. Nevertheless, for purposes of clarity of presentation, the following identifications are made: CO—command out; TO—zeroth bit of T register; INTON—interrupt enable/disable; RTON—real time clock enable/disable; X—register; Y—register; Z—register; YZR—right byte of word in registers; YZL—left byte; A—adder; ACD—distination accumulator; etc.

Further description of the design and operation of microprogrammed digital data processing systems (e.g., CPU 100 with μ Code 118) can be found in many publications in this art. Some particular references may be: *Computer Architecture*, Second Edition, by Caxton C. Foster, Copyright 1976 by Litton Educational Publishing, Inc.; *Computer Organization and Microprogramming*, by Yaohan Chu, Copyright 1972 by Prentice-Hall, Inc.; and *Foundations of Microprogramming*, by Ashok K. Agrawala and Tomlinson G. Rauscher, Copyright 1976 by Academic Press, Inc.

Further description of the design, operation, and uses of polynominal counters (shift register counters with feedback, e.g., RPC1 and RAC5), decode and control logic associated with such counters (e.g., RAC Increment Force 4, Control Gate 7, RAC Gate 8), microcode decoding logic (e.g., Microcode Decoding 11), and other logic circuitry shown in FIG. 9 and other figures can also be found in many publications concerning this art. Some particular references may include: *Computer Architecture* by Caxton C. Foster (see above); *Foundations of Microprogramming* by Ahok K. Agrawala and Tomlinson G. Rauscher (see above); Digital *Computer and Control Engineering* by Robert Steven Ledley, Copyright 1960 by McGraw-Hill Book Company, Inc.; *Digital Principles And Applications*, Second Edition, by Albert Paul Malvino, Ph.D., and Donald P. Leach, Ph.D., Copyright 1975 by McGraw-Hill Book Company, Inc.; *Digital Electronics With Engineering Applications* by Thomas P. Sifferlen and Vartan Vartanian, Copyright 1970 by Prentice-Hall, Inc.; and *Error Correcting Codes*, Second Edition, by W. Wosley Peterson and E. J. Weldan, Jr., Copyright 1972 by The Massachusetts Institute of Technology.

In operation, one should consider FIGS. 1–8 collectively. As noted, reference numerals in each figure begin with the figure number; for example, in FIG. 1 all reference numerals start at 100; in FIG. 2, 200; etc.

Crystal oscillator 104 provides a 10 mhz clock signal (other frequencies can be employed) to transceiver 103. Clock driver 119 (flip flop 403) in combination with circuitry of CPU 100 convert that clock signal to a 5 mhz signal (or some other half-frequency signal). Transceiver 103 receives the 10 mhz signal on terminal 10 MHZ (FIG. 4) and provides that signal to differential transmitter 416. Signal MCLOCK and $\overline{\text{MCLOCK}}$ (FIG. 4) are transmitted over I/O Bus 105 to device transceivers 106 and 111, wherein respective local clocks are developed. Each of these clocks have the same 10 mhz frequency as that of oscillator 104, however they are phase shifted due to propagation delays resulting from length of I/O Bus 105. At transceivers 106 or 111, terminals $\overline{\text{MCLOCK}}$ and MCLOCK each receive these out-of-phase 10 mhz signals as indicated by the receive arrow in FIG. 4.

In FIG. 4, terminal MCLOCK XENAB is set either high or low, one of the settings permitting CPU transceiver 103 to always transmit MCLOCK and $\overline{\text{MCLOCK}}$, and the other setting always permitting controller transceivers 106 and 111 to always receive MCLOCK and $\overline{\text{MCLOCK}}$. This setting is internal to each respective transceiver chip and does not relate to the yet-to-be described operation of transmit and receive modes of the transceivers. The foregoing describes operation by which a local clock is developed in each transceiver.

Similarly to the manner in which clock driver 119 provides α1,3 and α2,4 clocks to CPU 100, clock drivers 124 and 125 perform similar functions for controllers 108 and 113 respectively. Accordingly, respective local MCLOCK, $\overline{\text{MCLOCK}}$ from transceivers 106 and 111 operate flip flop 403 to provide α1,3 and α2,4 pulses to controllers 108 and 113 respectively.

The foregoing is related to transmission of the master clock signal which is generally uni-directional, from crystal oscillator 104 to transceiver 103, to transceivers 106 and 111, to controllers 108 and 113. However, data, with its associated synchronizing clock burst or bus clock (BIOCLOCK), is bi-directional; the bi-directional character of the system should be kept in mind, a transceiver acting either as a TRANSmitter or reCEIVER. The BIOCLOCK signal is thus transmitted with data from CPU transceiver to device transceiver when the CPU transceiver is in a transmitting mode, and the BIOCLOCK signal is return transmitted with other data from device transceiver to CPU transceiver when the device transceiver is in a transmitting mode.

Consider CPU 100 to be transmitting a signal to I/O bus 105 and one of the device transceivers receiving that signal. When in an output or transmitting mode, unidirectional line of conductor group 102 (input pad 307) is low and CPU 100 generates clock pulses or a clock burst designated "CLOCK pad" in FIG. 3b on clock pad 305. These pulses can be a burst of nine changes-of-state which proceed from clock pad 305 to CPU transceiver 103 by way of one of the bi-directional lines 102. The clock burst provides timing for the data transmitted (simultaneously but serially) out of pads 206 and 215, and for the initial command bit per byte (thus nine state changes).

In synchronism with the first of nine changes of state there are transmitted from pads 206 and 215 command or prefix or preset bits from shift registers 201/202 and 210/211 respectively. As later described, these bits establish the nature of the word; e.g.: an instruction word. These nine bits thus correspond to a command pulse, followed by 8 data bits on each line. A 16 bit word is thus divided into two 8 bit bytes, each byte being preceded by a command or control bit.

The clock burst plus the two serial data streams are transmitted to CPU transceiver 103 as follows. Clock pad 305 is connected to I/O CLOCK (FIG. 4) and data streams from pads 206 and 215 are fed to D1 and D2 (FIG. 4) respectively. As noted, the INPUT terminal is low when in a transmitting mode, and flip-flop 409 responds to this condition by enabling gates 404, 405, 406, and 407 in a manner to pass signals on terminals I/O CLOCK, D1, D2 and 10 MHZ respectively therethrough. The clock burst and the data streams are shifted into transceiver 103 on a bit-by-bit basis, the 5 MHZ clock burst operating with, or controlled by, flip-flop 400 and each bit of data being stored momentarily either on flip-flops 401 (from D1) or 402 (from D2). By operation of flip-flops 400, 401, and 402 transmission gates 410, 412, and 414 are enabled and one 10 MHZ clock pulse and its respective two data pulses are simultaneously and differentially transmitted over the BUS to a receiving transceiver.

More particularly, referring still to FIG. 4, flip-flop 400 is set and latched; it is set by the combined occurrence of the INPUT signal, the first pulse of the 5 MHZ I/O CLOCK burst (passing through gate 404) at the D terminal of flip-flop 400 and a 10 MHZ local clock pulse (passing through gate 407) at the CK terminal of flip-flop 400; it is latched by the connection from $\overline{\text{Q}}$ output of flip-flop 400 to the input of gate 404. As noted above, when flip-flop 400 is set, differential gate 410 is enabled, thus permitting 10 MHZ local clock pulses appearing at the other input of gate 410 to be transmitted as BIOCLOCK (and of course $\overline{\text{BIOCLOCK}}$, the complementary pulses intended to be included where appropriate) pulses. However, since the local 10 MHZ clock pulses also appear at the CK inputs of flip-flops 401 and 402, these clock pulses permit the setting of these two flip-flops with the occurrence of certain 10 MHZ clock pulse edges, and these edges are chosen to fall within the center of the 5 MHZ data pulses appearing at the D inputs of flip-flops 401 and 402 (via gates 405 and 406). Thus the data pulses are sampled by flip-flops 401 and 402 responding to the local 10 MHZ clock, and the Q outputs representing these samples are transmitted through gates 412 and 414 as signals BIO1 and BIO2, and these data samples are transmitted over the bus simultaneously and synchronously with its 10 MHZ sampling pulse, BIOCLOCK.

Next consider one of the device transceivers to be receiving the CPU transmitted signals. The INPUT signal for the receiving transceiver is high, and flip-flop 409 responds to this high signal to enable gates 404–407 properly for this receiving mode. Clock burst (BIOCLOCK & $\overline{\text{BIOCLOCK}}$) is received in differential receiver 411 and data pulses are received in differential receivers 413 and 415 respectively. Again, the clock burst, upon operation of AND/OR gate 407 with flip-flop 400, samples the data pulses upon operation of flip-flops 401 and 402.

More particularly, still referring to FIG. 4, BIOCLOCK, received via receiver 411 is conducted through gate 407 to the CK inputs of flip-flops 400, 401, and 402; synchronously therewith BIO1 and BIO2, received via receivers 413 and 415 are conducted via gates 405 and 406 respectively to D inputs of flip-flops 401 and 402. The 5 MHZ data streams BIO1 and BIO2 are thus again sampled by flip-flops 401 and 402 responding to certain edges of the 10 MHZ BIOCLOCK signal, and again these edges are chosen to fall within the center of the 5 MHZ data pulses. Flip-flop 400 toggles responsive to the 10 MHZ BIOCLOCK signal at its CK input, and thus reconstructs a 5 MHZ I/O CLOCK pulse train, the I/O CLOCK pulse train and the Q outputs from flip-flops 401 and 402 are synchronously conducted to terminals I/O CLOCK, D1, and D2 respectively, and thereafter to the device controller of this example.

The data bits stored on flip-flops 401 and 402 of a device controller transceiver, in the receiving mode, are stored at a 5 mhz rate. Because of propagation delay and other factors mentioned in the background section, these data pulses to be sampled may be skewed, distorted, etc. The better place to sample this kind of data pulse is away from the data pulse's leading or trailing edges. Thus, the 10 mhz sampling which permits data sampling at the time of occurrence of the edge which occurs at or near the center of the larger interval 5 mhz data pulse always permits an away-from-data-edge sample. This sampling is accomplished by at least flip-flops 401 and 402 responding to BIOCLOCK via AND/OR gate 407.

Thereafter the sampled data is serially shifted out of transceiver 106 into IOSR 120 if that is the receiving transceiver/controller combination whose device code is matched (discussed below). The clock is transmitted through terminal designated I/O CLOCK (FIG. 4) into IOSR 504 and the data paths are from D1, D2 (FIG. 4) into I/O DATA 1 and I/O DATA 2 (FIG. 5) respectively. The directions of receive and transmit modes in FIG. 4 are clearly shown. When the CPU transceiver is transmitting, the other transceiver in communication must be receiving.

The CPU and its transceiver and the device controllers and their respective transceivers are normally in receiving modes. In other words each component is normally operative to receive a signal from another device. The CPU's IOSR upon command from microcode 118, can be made to acquire a transmitting mode, accompanied by generation of a signal on the unidirectional conductor of group 102 as noted earlier. However, no other signal need be generated in any of the receiving end components in order for them to be receptive to the CPU transceiver because the other components are already in normally receiving modes.

With respect to FIG. 2, it should be understood that there are shown four-bit shift registers, each capable of storing either the odd or the even bits of either the left or the right byte of the data word. The data is transferred from the shift registers to other components in the host component, e.g., the CPU, in a parallel manner. For example, contents of the b BUS are loaded into the shift registers when command "b→IOSR" is enabled; thus b1, b3, b5, b7 are parallel loaded into the shift register 201; similarly the other "b" data is loaded into the other three shift registers.

The other command "IOSR→ā" when enabled parallel transfers data stored in the shift registers to the ā BUS. Thus ā1, ā3, ā5, ā7 are loaded into the ā BUS from shift register 201, and similarly the other "a" data is parallel transferred simultaneously. However, the shifting-in of data to, and shifting-out of data from, the shift registers from pads 206 and 215 are done in a serial manner.

Figure 7:
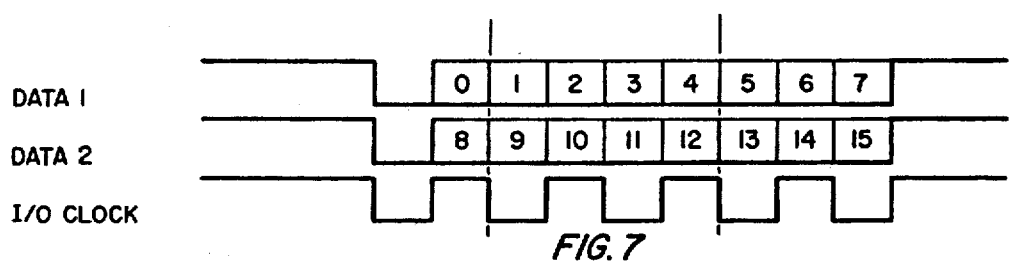
FIG. 7 is an illustration of two eight bit bytes of a sixteen bit data word, with a command or prefix bit preceding each byte, and the associated clock burst.

The serial nature of the input and output transmission of data is noted in FIG. 7. Output or input data with regard to pad 206 can be depicted in the form of DATA 1; output or input data with regard to pad 215 can be depicted in the form of DATA 2; and clock input or output burst on pad 305 is represented by I/O CLOCK. From this representation of data bits, it is seen that MUX DRIVER 205 alternates the serial bit flow from shift registers 201 and 202; likewise, MUX DRIVER 214 alternates serial bit flow from shift registers 210 and 211.

Figure 8:
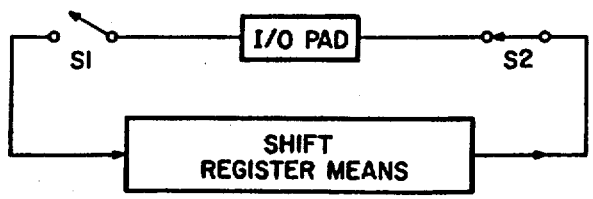
FIG. 8 is a schematic representation of the operation of either shift register means of FIG. 1.

FIG. 8, represents the operational effect of shift register means of FIG. 2. For example, I/O PAD in FIG. 8 can be pad 206. The I/O pad transmits when functional switch S2 is closed and, I/O pad receives information to the shift register means when function switch S1 is closed. Functional switches S1 and S2 are mutually-exclusively open or closed. This schematic representation of FIG. 8 is applicable to first shift register means 201, 202 handling the left byte and second shift register means 210, 211 handling the right byte in FIG. 2.

Referring to FIG. 7, the first bit in each of the data words are the command or prefix or preset bits. In the figure they are shown as zero bits. This condition is decoded by a receiving component (e.g. controller 108) as an I/O instruction, or an instruction word. These command bits are established by command decode 208, responsive to α2 and α4 clock pulses and to command pulses from CPU microcode 118. Other combinations of values for the command bits designate other kinds of words, discussed further hereinbelow.

In referring to FIG. 2, when command 1→IOSR is enabled in all four shift registers; this presets all "1's" into all four shift registers. Thus, if DATA 1 and DATA 2 of FIG. 7 are being received by pads 206 and 215 of IOSR 101, and thus at the inputs of shift registers 201, 202, 210, and 211, for example, when a zero is detected in level shift 203, that zero is the zero command bit of DATA 1 (since 1's were previously preset). At that point in time φ2 CUTOFF is generated and is applied to phase splitter 306 which inhibits further generation of clock pulses φ1 and φ2 in this input mode. Prior to cutoff time, clock pulses φ1 and φ2 were generated since the circuitry in FIG. 2 was in input mode, and data was being clocked in, in synchronism with the clock received on clock pad 305 from BIOCLOCK, which permitted generation of φ1 and φ2, which in turn permitted generation of A1 and A2 signals for shifting-in data into the shift registers.

Considering FIG. 5, input/output shift register 504 receives data serially on its I/O DATA 1 and 2 inputs and in synchronism with I/O CLOCk. The first two data bits, as noted, are command bits. If they are both zeros this is interpreted to be an I/O instruction word and the remaining 16 bits are parallel transferred from IOSR into instruction register 503. The word is then transferred into state change logic 500 wherein a comparison is made with device code 508 which is also connected (not shown) to state change logic 500.

If controller 108 bears a device code which matches the device code indicated in the last six bits of the I/O instruction word then the following procedure takes place within that particular controller. Depending on the nature of the instruction, one of the registers in register means 505, 506, 509 is operated upon and "a" BUS provides that word to the respective peripheral device if required.

Similarly a peripheral device connected to this controller can provide signals back through the controller, at least through b BUS into IOSR 504. From there the signals are transmitted back out through its respective transceiver and back to the CPU. Of course in this transmitting mode for this controller the OUT terminal is operated upon to convert a normally receiving mode for this set of transceiver/controller components into a transmitting mode. The OUT terminal in FIG. 5 is the unidirectional arrow of the group 107 in FIG. 1.

The other signals which are transmitted from the device are indicated at the righthand side of the diagram in FIG. 5. As noted earlier some of the signals are transmitted by way of bypass BUS 122, such as $\overline{INTR}$ (corresponding to $\overline{INTP}$) and $\overline{DCHR}$ (corresponding to $\overline{DCHP}$).

With regard to FIG. 5, 500 is responsive to at least the operation of PLA 502 and the instruction from IR means 503. State change logic 500 selects a logic state as the next successive state after termination of the present state. All controller-generated states are stored in PLA 502, having stored therein information in a read only memory (ROM) for controlling operation of at least the controller's register means.

Continuing with operation of structure depicted in FIG. 5 control logic of the IOC or device includes PLA 502, state change logic 500, and state counter 501. Control logic determines operations that are performed during data channel sequences and during execution of I/O commands. The PLA contains information that defines machine states or logic states of the IOC. State change logic 500 determines order in which the IOC or device controller enters various logic states defined in programmable logic array 502. The order in which it selects the states depends on information received from PLA 502, and status information received from other components of the IOC.

State counter 501 is a register that contains the address of information stored in PLA 502 that defines the current state of the device controller. Address register 505 is a 15 bit register whose contents are incremented during data channel sequences and are transmitted to its respective transceiver if external registers are not enabled. Word count register 506 is a 16-bit register whose contents are incremented during data channel sequences. T register 507 is a 16-bit register which contains the direction indicator and data channel address during data channel sequences. Device code register 508, polarity bit and external register enable bit structures are loaded with information received from the peripheral device via b bus during execution of an IORST (input/output reset) command. Device code register 508 is a 6-bit register, which as noted, works in connection with state change logic 500 to permit the IOC to execute an I/O command only if bits 10-15 of the command are equal to contents of 0 to 5 respectively of device code register 508. In other words if an 18-bit word as shown in FIG. 7 is conducted to IOSR 504 of the device controller as an I/O instruction word (determined by the first bit of each 9-bit byte), is written into the instruction register 503. Then a comparison is made in state change logic 500 between the six right-most bits of the word with device code register 508. If there is a match then the device controller knows that this instruction was intended for itself.

Polarity bit indicator is a substructure of structure 508 and is a one-bit register that determines sense of data bits transmitted and received from the peripheral device. If this bit contains a 1, a low level on data pins connected to the device is interpreted as a 0, and a 0 is transmitted to those pins of a low level. If the polarity bit contains 0, data transferred to data pins of the device have the opposite effect.

The external register enable bit is again a 1-bit register. If this bit contains a 0, the data channel address transmitted during data channel sequence is the contents of memory address register 505. Otherwise, the data channel address is information received from the peripheral device.

Mask out driver 509 and interrupt disable logic 513 together determine contents of the 1-bit register called interrupt disable bit. Contents of this bit are altered only during execution of a MSKO (mask out) command. The device controller only makes program interrupt requests when contents of the interrupt disable bit are equal to 0.

Busy/done logic 512 contains two 1-bit registers called busy bit and done bit. Contents of these bits are loaded by operations performed during execution of I/O commands and by operations performed on the device by the peripheral device. Contents of these bits are transmitted over the bypass bus during execution of an I/O skip command. Interrupt request logic 514 determines when the device controller is making a program interrupt request. It contains a 1-bit register called interrupt request bit. The device controller is making an interrupt request when this bit contains a 1. The data channel request logic 515 determines when the device controller is making a data channel request. It contains a 1-bit register called a data channel bit. The device controller makes a data channel request when this bit contains a 1.

Summarizing four types of transmission on the I/O BUS means, again refer to FIG. 7. Each of the four types consists of a control bit and eight data bits transmitted on two data lines (four data lines considering differential transmission). The four types are identified by encoding of control bits. A logical "one" may be represented on the bus by a high signal.

The first bit of each 9-bit byte is shown as a 0 and the two 0's are decoded to means an input/output instruction or I/O command.

However, if the command bit of DATA 1 is low and the command bit of DATA 2 is high, this is used to indicate a transmission of data from CPU to a selected peripheral device during programmed I/O and data channel breaks. There are three data formats utilized in this data-type of transmission: (1) Ordinary data, where bits 0-15 are employed as a 16-bit data word; this is utilized on certain commands and for transfers of data during data channel cycles; (2) I/O Skip wherein bits 2-15 are ignored; bit 0 is employed to represent $\overline{DONE}$ and bit 1 is employed to represent $\overline{BUSY}$; this format is utilized when a device replies to an I/O skip instruction; (3) Data Channel Address is the third data transmission format wherein bits 1-15 are employed as a memory address; bit 0 is employed to represent input or output, "1" representing an input and "0" representing an output; this format is utilized when a peripheral device replies to a data channel address request.

The next combination for command bits would be DATA 1 high and DATA 2 low; this relates to data channel address request (DCADRQ) from CPU to I/O bus. This type of request indicates that the highest priority peripheral device requesting a data channel cycle should send the memory address it wishes to use to the CPU by way of by-pass bus 122 or 123 and bus 105.

Finally, if command bits are 1, 1 this is intended to represent a request enable (RQENB) from CPU 100 to the input/output structure. This word synchronizes external interrupt requests and data channel requests received from peripheral devices 110, 115, etc., that might otherwise create competing-request difficulties.

Referring next to FIG. 9, a block diagram of electronic structure incorporated within CPU 100 which provides automatic and hidden refreshing of the dynamic MOS memory of the data processing system is provided. The implementation of each of the functional blocks presented therein has been accomplished by way of MOS technology, the detail of which is not presented herein for purposes of improving clarity of presentation of the present invention. The functional blocks are fabricated from standard MOS digital circuitry. For example, Refresh Period Counter 1 and Refresh Address Counter 5 are polynominal counters, (essentially, shift registers with feedback).

Refresh Period Counter (RPC) 1 receives signal inputs $\omega$ and $\bar{\omega}$. These signal inputs are related to clock pulse $\alpha1$ through $\alpha4$ as shown in the waveform diagram of FIG. 9. RPC1 counts up to a predetermined count, in this instance no higher than 63, being a polynomial counter and counting up to $2^N - 1$, where $N = 6$ in this case. Six signals are generated from this counter and are designated $RPC_0$ through $RPC_5$ or $RPC_{0-5}$ inclusive. These signals are conducted to RPC Zero Count Detector 3 as shown; this detector is a gate which indicates when the count is 0, that signal indication being conducted to RPC Count Preset 2 as well as to RAC (Refresh Address Counter) Increment Force 4.

RPC Count-Preset 2 provides a preset count by way of three "JAM" signals $J_1$ through $J_3$ or $J_{1-3}$ inclusive to RPC 1; this operation is employed to maintain the maximum count of RPC 1 less than 63 to avoid the forbidden state associated with the polynomial counter, and when the system clock is chosen to be other than that with which the system was originally designed to operate. This count preset further reduces the maximum count to insure that signal RPC=0 will occur within the refreshing interval required (in this case, about 30 microseconds, the details relating to this number presented hereinbelow), when the system clock is chosen to be a slower rate.

Referring to RAC Increment Force 4, output $\omega'$ is provided and occurs when signal RPC=0 occurs. In fact, $\omega'$ can be defined in Boolean language as (RPC=0)·($\omega$)·(RAC=0·$\overline{FORCE77}$), which implies that RAC Increment Force 4 receives input RPC=0, the output from RAC Zero Count Detector 6; also, RAC Increment Force item 4 receives clock type signals $\alpha$ and $\omega$ as shown.

Control gate 7 and Refresh Address Counter 5 are not made to count unless $\omega'$ occurs, which is a function of zero count detection by RPC 3. Thus the state of RAC 5 is a function of operation of RPC1.

RAC5 receives signals $\bar{\omega}$, $\overline{FORCE\ 77}$, and $\omega'$ as noted, and provides output $RAC_{10-15}$, another 6 signals. $RAC_{10-15}$ is conducted to RAC gate 8 along with signals $\omega$ and $\omega'$; RAC gate 8 provides a six signal output only in response to the occurrence of these signals with gating signal RAC→MEM obtained from microcode decoder 11. Microcode decoder 11 receives clock signals $\alpha_{1-4}$ and microinstructions R22 and R23, the decoding of which provide the gating or command signal RAC→MEM. In this manner, the RAC→MEM signals are integrated or distributed into the overall operation of the data processing system.

Output from RAC gate 8 is labelled $\overline{RA}_{10-15}$, the six signals used to address memory 116 (FIG. 1), by way of memory bus 117 in FIG. 1. Shift pulse generator 9 receives clock pulses $\alpha_{1-4}$ and provides $\omega$ and $\bar{\omega}$, the waveforms being indicated in the figure. It is the output from this shift pulse generator 9 which provides the various alpha and $\omega$ clock and timing pulses to the structure denoted.

Finally, clock interrupt request generator 10 receives an input from control gate 7 as well as inputs $R_{11-13}$, $\omega$ and $\alpha$, to provide output RTCRQ (Real-Time Clock Request). Although interrupt is not necessarily generated thereby, it does provide means for marking real time.

The foregoing general interconnection of structure depicted in FIG. 9 leads to consideration of operation of this circuitry. First, recall that MOS dynamic RAMs, by inherent nature of their design, require periodic refresh or replenishment signals. The time during which each bit of storage on the RAM is guaranteed to hold its data without being refreshed is known as "fresh time"; thus, for a given dynamic RAM chip, every memory cell in the RAM must be refreshed at least once during refresh time specified for that particular chip. The refresh time for most dynamic RAMs is about two milliseconds. Therefore, for the 4K RAMs which are used in the data processing system of the present invention, every memory location bit is refreshed at a rate of at least once every two milliseconds. Thus refresh period counter RPC 1 counts one sixty-fourth of refresh time.

In operation, RPC 1 is initially preset to a specific count (less than 63) by RPC count preset circuitry 2; then RPC 1 counts down to 0. RPC 1 repeats this countdown procedure 64 times in succession during the two milliseconds required to refresh all of the memory cells or memory locations in the RAMs employed in the memory.

Every time RPC 1 reaches 0, this event is detected by RPC detector 3 which also activates RPC Count Preset 2 to preset the count into RPC 1 so that RPC 1 may begin counting once again down to 0 in a successive or repetitive fashion. RPC detector 3 also activates RAC Increment Force 4, which serves to force RAC 5 to increment by one count.

As noted, RAC 5 is a polynomial counter, and being a 6 bit counter can inherently generate only 63 refresh addresses. To generate the 64th address, which in this case may be 77 octal (or all 1's), circuitry in RAC Detector 6 is employed, RAC detector 6 detects when refresh address counter 5 is zero, since signal $RAC_{10-15}$ is conducted to detector 6. Detector 6 then blocks generation of the next increment signal to RAC 5 which would otherwise be generated by RAC Increment Force 4, and then forces output of RAC 5 to all ones by way of signal FORCE 77 from control gate 7. Control gate 7 includes a flip flop to account for this particular force operation, this state remaining for one complete cycle of RPC 1, (about 30 microseconds) whereafter the flip flop (not shown) in item 7 is cleared and RAC 5 is permitted to continue to count in its normal fashion. The foregoing describes the reasons and technique for forcing counter 5 to provide 64 rather than 63 counts.

RAC 5 thus presents one of 64 refresh addresses to the dynamic RAMs by way of RAC gate 8, in order to refresh all 4096 bits in each RAM chip. It should be noted that the signal outputs from structures 5 and 8 are 6 bit words, which account for 64 different addresses. A refresh signal, or voltage, is then applied with sufficient current capability to recharge all the inherent or parasitic capacitance associated with the 64 memory cells.

Shift Pulse Generator 9 effectively divides a clock pulses in the system by two and produces the shift pulses necessary for operation of polynomial counters 1 and 5. Clock interrupt request generator 10 receives an input from control gate 7, microinstructions $R_{11}$-$R_{13}$ inclusive, and ω and α signals to generate a real-time clock interrupt request (RTCRQ) each time the refresh address counter RAC 5 makes one complete cycle to all 64 refresh address (about every two milliseconds). This signal, RTCRQ, can be used to make time or can be ignored as desired.

Figure 10:
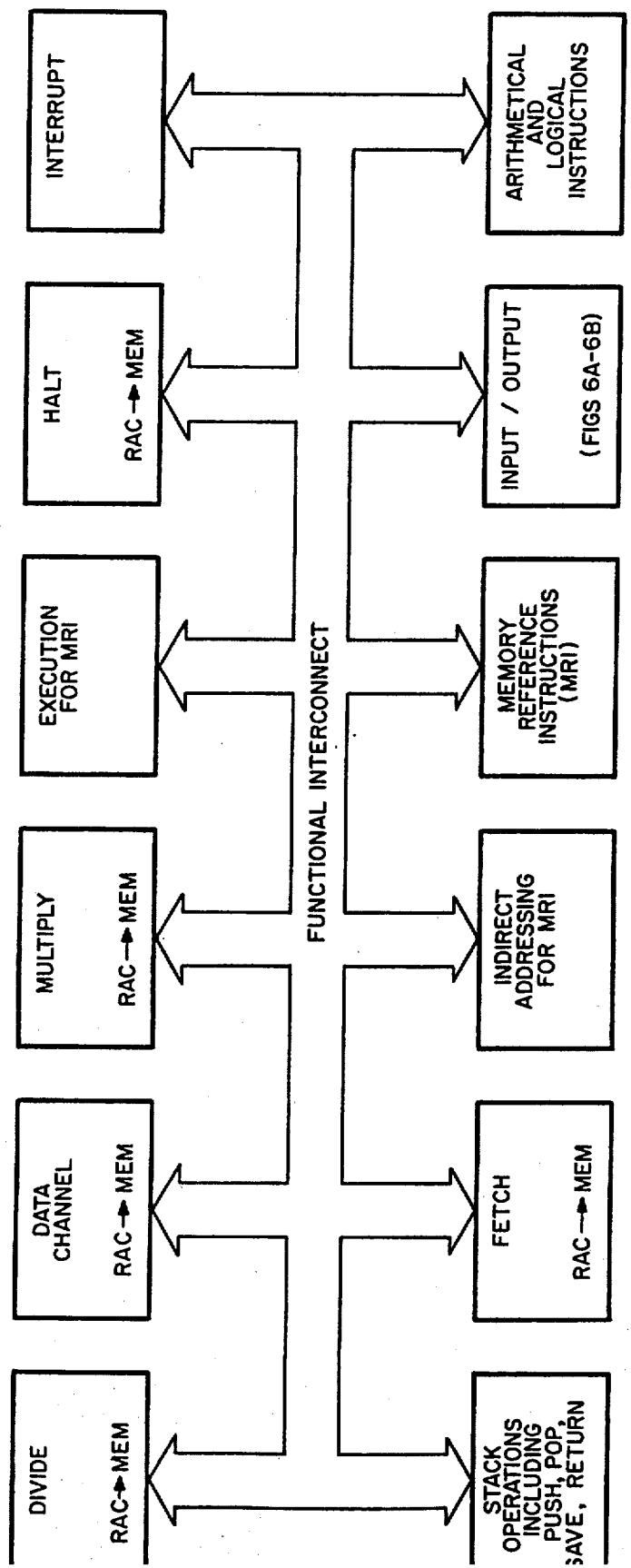
FIG. 10 is a schematic representation of all operating modes or functional states of the CPU of FIG. 1.

Having just described the interconnection and operation of the component parts of the present invention to produce the desired addressing result, consideration of the microcode which permits the hidden refreshing aspect of the present invention is now discussed. The algorithm which guides the operation of the CPU, is the step-by-step procedure followed by the CPU to perform its function. (In this case the CPU is a microprocessor since the CPU is contained within one MOS integrated circuit chip.) Referring to FIG. 10, the algorithm can be conceptually and practically divided into a number of system operating modes which include FETCH, MULTIPLY, DIVIDE, DATA CHANNEL, HALT, INPUT/OUTPUT, and others. (The flow chart depicting INPUT/OUTPUT is shown in FIGS. 6A and 6B and a schematic representation of operating modes of the entire CPU 100 is shown in FIG. 10.) These above-noted operating modes, except for INPUT/OUTPUT, each contain an operating state designated RAC→MEM, to indicate that a signal from Refresh Address Counter 5 should be forwarded from CPU 100 (FIG. 1), to memory bus 117 (FIG. 1) to refresh MOS memory 116 (FIG. 1).

FIG. 10 shows in a summarized manner, all of the operating modes or functional states which the microprocessor or CPU 100 can call upon in order to control the overall binary information processing function. There are twelve blocks or functional modes shown, and they are all interconnected by depicted "Functional Interconnect". This figure intends to show not a hard-wire or bus-wire interconnection between hardware components, but a functional interconnection between microprocessor functional modes. Accordingly, there is not necessarily a functional interconnection from one particular functional mode, e.g.: INPUT/OUTPUT to each and every other functional mode. (Referring to FIGS. 6A-6B, there is no functional connection from INPUT/OUTPUT to, for example, DATA CHANNEL.) However, each functional block is certainly functionally connected to at least one other functional block. The Functional Interconnect is intended to represent this variation in functional connection or communication, and is depicted as such in order to improve clarity of presentation.

The important feature represented in FIG. 10 is the RAC→MEM state, one of many states, incorporated within functional blocks DIVIDE, DATA CHANNEL, MULTIPLY, HALT, and FETCH. The memory refreshing instruction or command is thus "built-into" the CPU algorithm from which FIG. 10 is derived.

Accordingly, if the system is operating in either FETCH, MULTIPLY/DIVIDE, DATA CHANNEL, or HALT modes, referring to FIG. 10, then it is guaranteed that a RAC→MEM signal will be generated during a respective mode if permitted to complete without being subjected to an interrupt signal. During these modes, the memory is idle anyway, although other portions of the system may be active, so this idle time is spent efficiently and usefully in refreshing the memory whereby the overall system operation need not be delayed by operation of the refreshing apparatus.

As already noted, physical constraints imposed by use of MOS technology require refreshing each memory cell at least once every 2 milliseconds. The 4K MOS RAM employed in this data processing system is arranged in 64 rows and 64 columns; thus 64 refreshing signals must be generated every 2 milliseconds, or one signal about every 30 microseconds (at least one signal during each successive 30 microsecond interval). Therefore, by counting the number of states in the CPU algorithm, (and only the RAC→MEM state is highlighted in FIG. 10 for purposes of clarity of illustration), and knowing that each state has a duration of about 0.48 microseconds for the data processing system employing the present invention, then one can determine that no more than about sixty states can be permitted between RAC→MEM commands in order to provide one command each 30 microseconds (thereby refreshing one complete row or column of 64 memory states). Thus the RAC→MEM commands are distributed or integrated into the algorithm operating modes so that all flow chart, state-to-state, paths from one RAC→MEM signal to the next are less than about 60 states, notwithstanding interrupts.

Microinstructions corresponding to a RAC→MEM state have the proper arrangement of bits to be decoded by block 11, FIG. 9, into a RAC→MEM signal; thus the RAC→MEM refreshing commands are derived from these microinstructions and integrated into the overall operation of the data processing system without causing the system operation to be slowed down on behalf of memory refresh requirements.

The invention may be embodied in yet other specific forms without departing from the spirit or essential characteristics thereof. Thus, the present embodiments are to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. In a digital data processing system for performing at least one data processing algorithm composed of a sequence of data processing operations;
    said data processing system including
        dynamic memory means for storing and providing a sequence of instructions representing said sequence of data processing operations;
    CPU responsive to each one of said instructions for performing a data processing operation corresponding to each one of said instructions, each one of said data processing operations composed of a sequence of CPU operating states,
        said CPU including microinstruction control means connected from said dynamic memory means and responsive to said each one of said instructions for storing and providing to said CPU a corresponding sequence of microinstructions for selecting each one of a corresponding said sequence of CPU operating states; and, system clock means for providing timing pulses to said CPU for controlling occurrence of each of said microinstructions;

memory refresh means for refreshing said dynamic memory means at successive first certain time intervals, each one of said successive first certain time intervals being less than a predetermined refresh time interval, said memory refresh means comprising:

microcode decoding means connected from said microinstruction control means and responsive to each one of selected certain of said microinstructions for providing refresh gate signals indicating said dynamic memory means is to be refreshed, said certain of said microinstructions being selected by said decoding means for each one of said at least one data processing algorithm so that at least one of said certain of said microinstructions will be provided by said microinstruction control means during said each one of said successive first certain time intervals;

first counter means responsive to said system clock means for generating refresh timing pulses occurring during said each one of said successive first certain time intervals;

second counter means responsive to said refresh timing pulses for generating successive memory refresh address signals for refreshing a plurality of successive portions of said dynamic memory means; and, refresh address gating means for receiving said successive memory refresh address signals and responsive to said refresh gate signals to provide said memory refresh signals to said dynamic memory means upon occurrence of said each one of said certain of said microinstructions to refresh said successive portions of said dynamic memory means.

2. The memory refresh means of claim 1 and wherein said first and second counter means are polynomial counters.

3. The memory refresh means of claim 1 and wherein said first counter means includes counter preset means for adjusting maximum count of said first counter means to select the duration of said first certain time intervals if frequency of said timing pulses provided by said system clock means is changed.

4. The memory refresh means of claim 1 wherein each said portion of said dynamic memory means contains a plurality of memory locations, said dynamic memory means contains N said portions, and said each one of said successive first certain time intervals is less than 1/N times said predetermined dynamic memory means refresh time interval.

5. The memory refresh means of claim 4 wherein said plurality of memory locations is about 4096, said each one of said successive first certain time intervals is about 30 microseconds, and said successive portions of said plurality of memory locations is about 64.

* * * * *